(12) United States Patent
Okura

(10) Patent No.: US 11,362,012 B2
(45) Date of Patent: Jun. 14, 2022

(54) SEMICONDUCTOR DEVICE

(71) Applicant: DENSO CORPORATION, Kariya (JP)

(72) Inventor: Yasushi Okura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/071,190

(22) Filed: Oct. 15, 2020

(65) Prior Publication Data

US 2021/0028085 A1    Jan. 28, 2021

Related U.S. Application Data

(63) Continuation of application No. PCT/JP2019/013440, filed on Mar. 27, 2019.

(30) Foreign Application Priority Data

May 18, 2018   (JP) .............................. JP2018-095980

(51) Int. Cl.
*H01L 21/02* (2006.01)
*H01L 23/367* (2006.01)
*H01L 23/00* (2006.01)

(52) U.S. Cl.
CPC .......... *H01L 23/3675* (2013.01); *H01L 24/32* (2013.01); *H01L 24/48* (2013.01); *H01L 24/73* (2013.01); *H01L 2224/32245* (2013.01); *H01L 2224/48175* (2013.01); *H01L 2224/73265* (2013.01); *H01L 2924/1033* (2013.01); *H01L 2924/10253* (2013.01); *H01L 2924/10272* (2013.01); *H01L 2924/1203* (2013.01); *H01L 2924/13055* (2013.01)

(58) Field of Classification Search
CPC .................... H01L 21/02362; H01L 21/02304
See application file for complete search history.

(56) References Cited

U.S. PATENT DOCUMENTS

2006/0016267 A1 * 1/2006 Tanaka ................. G01L 9/0054
                                                          73/754

FOREIGN PATENT DOCUMENTS

| JP | 2016086069 A | 5/2016 |
|----|--------------|--------|
| JP | 6224292 B2 | 11/2017 |

* cited by examiner

*Primary Examiner* — Mohammad M Choudhry
(74) *Attorney, Agent, or Firm* — Posz Law Group, PLC

(57) ABSTRACT

In a semiconductor device, a first protection film covers an end portion of a first metal layer disposed on a semiconductor substrate, and has a first opening above the first metal layer. A second metal layer is disposed on the first metal layer in the first opening. An oxidation inhibition layer is disposed on the second metal layer in the first opening. A second protection film has a second opening and covers an end portion of the oxidation inhibition layer and the first protection film. The second protection film has an opening peripheral portion on a periphery of the second opening, and covers the end portion of the oxidation inhibition layer. An adhesion portion adheres to a portion of a lower surface of the opening peripheral portion. The adhesion portion has a higher adhesive strength with the second protection film than the oxidation inhibition layer.

10 Claims, 12 Drawing Sheets

SEMICONDUCTOR DEVICE

CROSS REFERENCE TO RELATED APPLICATIONS

The present application is a continuation application of International Patent Application No. PCT/JP2019/013440 filed on Mar. 27, 2019, which designated the U.S. and claims the benefit of priority from Japanese Patent Application No. 2018-095980 filed on May 18, 2018. The entire disclosures of all of the above applications are incorporated herein by reference.

TECHNICAL FIELD

The present disclosure relates to a semiconductor device.

BACKGROUND

A semiconductor device may have an electrode of a multilayer structure joined to a semiconductor substrate with a solder. As an example of the structure of the multilayer electrode, a first metal layer is formed on a surface of the semiconductor substrate, and a first protection film is formed on the first metal layer. For example, the first metal layer may be made of aluminum (Al), and the first protection film may be made of a polyimide. The first protection film is formed with a first opening on the first metal layer. A second metal layer is formed in the first opening and on the first metal layer. Further, an oxidation inhibition layer is formed on the second metal layer in the first opening. For example, the second metal layer may be made of nickel (Ni), and the oxidation inhibition layer may be made of gold (Au). Such a semiconductor device may further have a second protection film formed to cover the end of the oxidation inhibition layer and the first protection film. The second protection film may be made of a polyimide.

SUMMARY

The present disclosure describes a semiconductor device having an adhesion portion adhering to a portion of a lower surface of an opening peripheral portion of a second protection film with an excellent adhesive strength to the second protection film, to thereby suppress an occurrence of crack in a first metal layer.

BRIEF DESCRIPTION OF DRAWINGS

Features and advantages of the present disclosure will become more apparent from the following detailed description made with reference to the accompanying drawings, in which.

DETAILED DESCRIPTION

Figure 1:
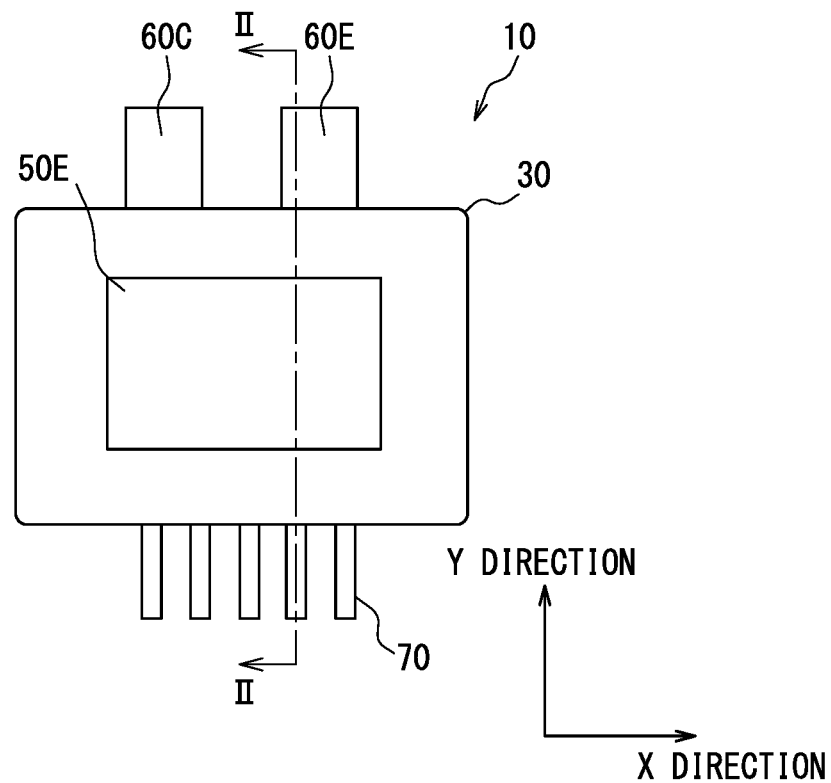
FIG. 1 is a diagram illustrating a plan view of a semiconductor device viewed from the top according to a first embodiment.

As an example of a multilayer structure electrode of a semiconductor device, a first metal layer is disposed on a surface of a semiconductor substrate, and a first protection film is disposed on the first metal layer. For example, the first metal layer may be made of aluminum (Al), and the first protection film may be made of a polyimide. The first protection film is formed with a first opening on the first metal layer. Further, a second metal layer is disposed on the first metal layer in the first opening, and an oxidation inhibition layer is disposed on the second metal layer in the first opening. For example, the second metal layer may be made of nickel (Ni), and the oxidation inhibition layer may be made of gold (Au). Such a semiconductor device may further have a second protection film to cover the end of the oxidation inhibition layer and the first protection film. The second protection film may be made of a polyimide.

In such a semiconductor device, a solder is bonded onto the electrode. In a solder bonded state, a crack is likely to occur in the first metal layer directly under a boundary between the first protection film and the second metal layer, that is, directly under an edge surface of the second metal layer due to a stress caused in a power cycle or a thermal cycle.

If an adhesive strength between the oxidation inhibition layer and the second protection film is insufficient, there is a fear that an entirety of a peripheral portion on a periphery of the second opening in the second protection film will be separated from the oxidation inhibition layer due to a change in temperature during a manufacturing process or the like. If the separation occurs, the second protection film will not held on the end of the oxidation inhibition layer. As a result, similarly to a structure without having the second protection film, a solder is likely to wet and spread over the oxidation inhibition layer, causing a crack in the first metal layer.

According to an aspect of the present disclosure, a semiconductor device includes a semiconductor substrate having an element, a first metal layer, a first protection film, a second metal layer, an oxidation inhibition layer, a second protection film, and an adhesion portion. The first metal layer is disposed on a surface of the semiconductor substrate. The first protection film has a first opening above the first metal layer and covers an end of the first metal layer. The second metal layer is disposed on the first metal layer in the first opening. The oxidation inhibition layer is disposed on the second metal layer in the first opening. The second protection film has a second opening and covers an end of the oxidation inhibition layer and the first protection film. The second protection film has an opening peripheral portion on a periphery of the second opening, and the end of the oxidation inhibition layer is covered with the opening peripheral portion. The adhesion portion adheres to a portion of a lower surface of the opening peripheral portion of the second protection film, which faces the end of the oxidation inhibition layer, with a higher adhesive strength than the oxidation inhibition layer relative to the second protection film.

In such a configuration, the adhesion portion serves as an anchor. Thus, it is possible to restrict the second protection film from separating from the oxidation inhibition layer due to the change in temperature during a manufacturing process or the like. Even if the second protection film is separated from the oxidation inhibition layer in a region where the adhesion portion is not provided in the opening peripheral portion, the adhesion portion can hold the separated portion of the second protection film on the end of the oxidation inhibition layer.

As such, it is possible to restrict the solder from wetting and spreading onto the end of the second metal layer by the second protection film held on the end of the oxidation inhibition layer. Even if the separation described above is generated, the separated portion of the second protection film is held on the end of the second metal layer. Therefore, the thickness of the solder can be reduced. In this way, it is possible to restrict the solder from wetting and spreading as described above.

Accordingly, in the semiconductor device described above, it is possible to restrict the wetting and spreading of the solder onto the boundary between the second metal layer and the first protection film, hence an occurrence of crack in the first metal layer can be suppressed.

According to an aspect of the present disclosure, a semiconductor device includes a semiconductor substrate having an element, a first metal layer, a first protection film, a second metal layer, a second protection film, an adhesion portion, a solder, and a metal member. The first metal layer is disposed on a surface of the semiconductor substrate. The first protection film has a first opening above the first metal layer and covers an end of the first metal layer. The second metal layer is disposed on the first metal layer in the first opening. The second protection film has a second opening and covers an end of the second metal layer and the first protection film. The second protection film has an opening peripheral portion on a periphery of the second opening, and the end of the second metal layer is covered with the opening peripheral portion. The adhesion portion adheres to a portion of a lower surface of the opening peripheral portion of the second protection film, which faces the end of the oxidation inhibition layer. The metal member is connected to the second metal layer through the solder. The solder is spread to at least a portion above the second metal layer in a region directly under the opening peripheral portion and where the adhesion portion does not exist.

Hereinafter, embodiments of the present disclosure will be described with reference to the drawings. In the embodiments, functionally and/or structurally corresponding parts will be designated with the same reference numbers. Hereinafter, a plate thickness direction of a semiconductor substrate is referred to as a Z direction. A direction orthogonal to the Z direction is referred to as an X direction. A direction orthogonal to the Z direction and the X direction are referred to as a Y direction. A shape along an XY plane including the X direction and the Y direction is referred to as a planar shape, unless otherwise specifically noted.

First Embodiment (Schematic Structure of Semiconductor Device)

Figure 2:
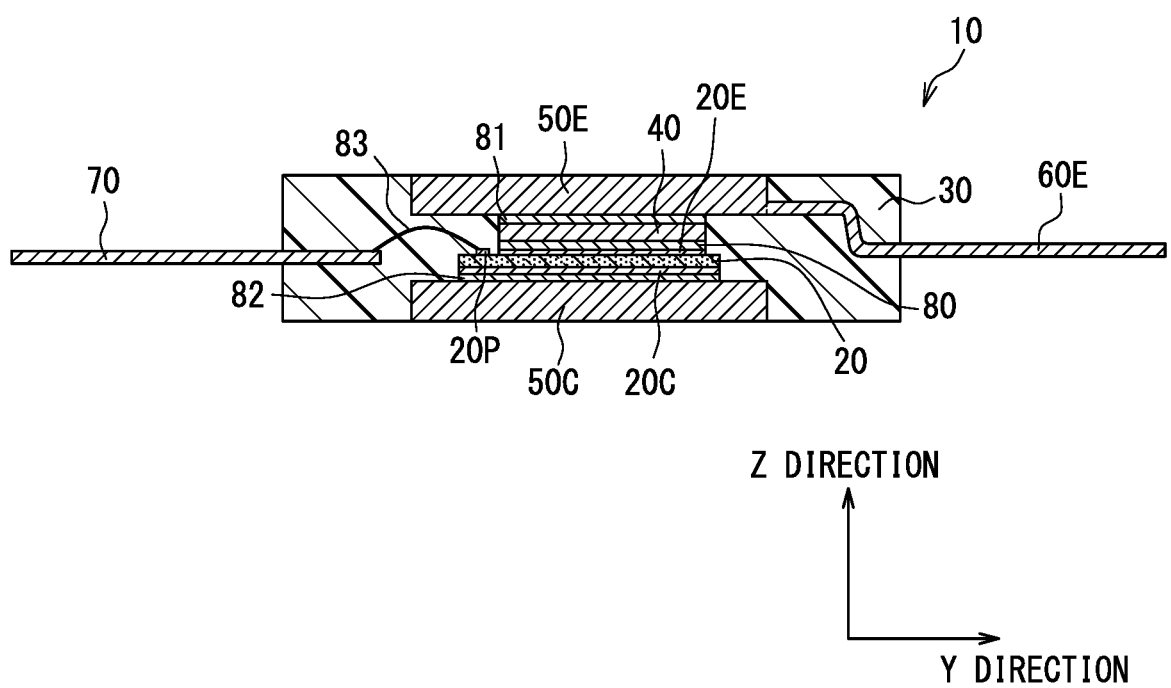
FIG. 2 is a diagram illustrating a cross-sectional view taken along a line II-II in FIG. 1.

A semiconductor device 10 shown in FIGS. 1 and 2 includes a semiconductor chip 20, an encapsulating resin body 30, a terminal 40, heat sinks 50C and 50E, main terminals 60C and 60E, and signal terminals 70. In FIG. 2, illustration of the semiconductor chip 20 is simplified for the sake of convenience.

The semiconductor chip 20 is provided by a semiconductor substrate formed with an element. The semiconductor substrate is made of Si, SiC, GaN, or the like. As the element, a so-called vertical-type element that allows an electric current in the Z direction as the plate thickness direction may be employed. In the present embodiment, as the vertical-type element, IGBT and FWD (reverse-flow diode) that is connected in anti-parallel with the IGBT are formed. That is, an RC-IGBT is formed. Note that, the IGBT and the FWD may be formed in separate semiconductor substrates.

The semiconductor chip 20 has an emitter electrode 20E on a surface facing in the Z direction, and a collector electrode 20C on a back surface opposite to the surface on which the emitter electrode 20E is formed. The emitter electrode 20E also serves as an anode electrode of the diode, and the collector electrode 20C also serves as a cathode electrode of the diode.

On the surface of the semiconductor chip 20 on which the emitter electrode 20E is formed, pads 20P as signal electrodes are also formed. The pads 20P are formed at locations different from the emitter electrode 20E on the surface.

The encapsulating resin body 30 encapsulates the semiconductor chip 20 and the like. The encapsulating resin body 30 is, for example, made of an epoxy-based resin. The encapsulating resin body 30 is molded such as by a transfer molding technique. The encapsulating resin body 30 has a generally rectangular shape as the planar shape.

The terminal 40 is interposed between the emitter electrode 20E and the heat sink 50E. The terminal 40E is located on a thermal and electrical conduction path between the emitter electrode 20E and the heat sink 50E. For this reason, the terminal 40 is made of at least a metal material so as to ensure a thermal conductivity and an electrical conductivity. The terminal 40 is arranged to face the emitter electrode 20E, and is connected to the emitter electrode 20E through a solder 80. The terminal 40 is connected to the heat sink 50E through a solder 81.

The heat sinks 50C and 50E each have a function of dissipating heat of the semiconductor chip 20 to the outside of the semiconductor device 10, as well as a function as a wiring. For this reason, the heat sinks 50C and 50E are each made of at least a metal material so as to ensure a thermal conductivity and an electrical conductivity. The semiconductor ship 20 is arranged between the heat sink 50C and the heat sink 50E in the Z direction. As described above, the heat sink 50E is connected to the emitter electrode 20E through the terminal 40 and the solders 80 and 81. The heat sink 50C is connected to the collector electrode 20C through a solder 82.

In the present embodiment, each of the heat sinks 50C and 50E is provided to encompass the semiconductor chip 20 in a projection view viewed in the Z direction. The heat sinks 50C and 50E each have a generally rectangular shape as the planar shape. The heat sinks 50C and 50E each have a generally constant thickness. The plate thickness direction of each of the heat sinks 50C and 50E is substantially parallel in the Z direction. The most parts of the heat sinks 50C and 50E are covered with the encapsulating resin body 30. Of surfaces of each of the heat sinks 50C and 50E, a surface opposite to the semiconductor chip 20 is exposed from the encapsulating resin body 30. In the Z direction, the heat sink 50E is exposed from one surface of the encapsulating resin body 30, and the heat sink 50C is exposed from a back surface of the encapsulating resin body 30, which is opposite to the one surface from which the heat sink 50E is exposed.

The main terminals 60C and 60E are terminals for external connections, and allow a main current to flow. The main terminal 60C is connected to the collector electrode 20C through the heat sink 50C. The main terminal 60E is connected to the emitter electrode 20E through the heat sink 50E and the terminal 40.

In the present embodiment, the main terminal 60C and the heat sink 50C are formed by processing a same metal plate, and are integral with each other, that is, provided as one piece. The main terminal 60C has a thickness smaller than the heat sink 50C, and connects to the heat sink 50C so as to have substantially a coplanar surface with the surface of the heat sink 50C opposite to the surface exposed from the encapsulating resin body 30. The main terminal 60C has a bent portion within the encapsulating resin body 30. The main terminal 60C projects from a surface of the encapsulating resin body 30 at a position close to a middle position in the Z direction.

Likewise, the main terminal 60E is provided integral with the heat sink 50E as one piece. The main terminal 60E has a thickness smaller than the heat sink 50E, and connects to the heat sink 50E so as to have substantially a coplanar surface with the surface of the heat sink 50E opposite to the surface exposed from the encapsulating resin body 30. As shown in FIG. 2, the main terminal 60E has a bent portion within the encapsulating resin body 30. The main terminal 60E projects from the same surface of the encapsulating resin body 30, from which the main terminal 60C projects, at the position close to the middle position in the Z direction.

As described above, the main terminals 60C and 60E both project from the same side of the encapsulating resin body 30. The projected parts of the main terminals 60C and 60E extend in the Y direction. The main terminals 60C and 60E each have the plate thickness direction substantially in the Z direction. The main terminals 60C and 60E are aligned in the X direction.

The signal terminals 70 are correspondingly connected to the pads 20P of the semiconductor chip 20. In the present embodiment, the signal terminals 70 are connected to the pads 20P through bonding wires 83 within the encapsulating resin body 30. The signal terminals 70 project from a side surface of the encapsulating resin body 30 to the outside, particularly, from the surface of the encapsulating resin body 30 opposite to the surface from which the main terminals 60C and 60E project.

(Details of Semiconductor Chip)

Figure 3:
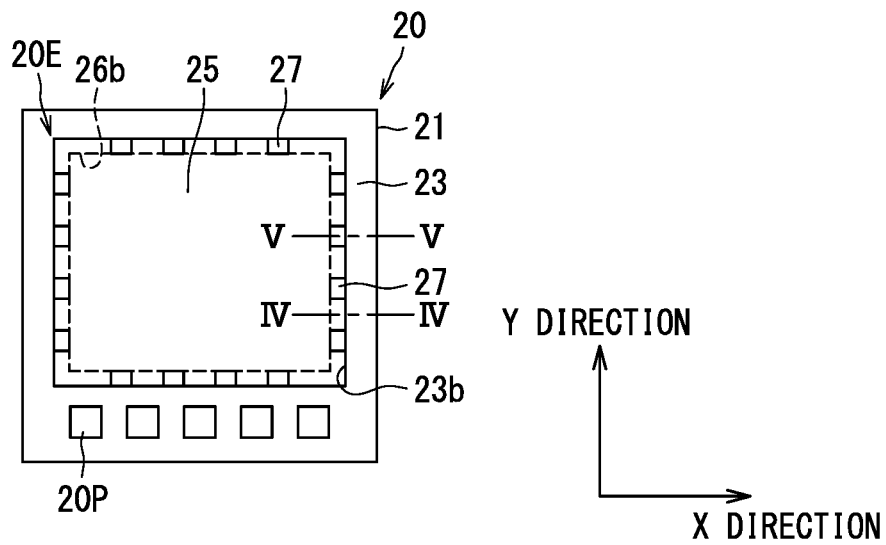
FIG. 3 is a diagram illustrating a plan view of a semiconductor chip of the semiconductor device.
Figure 4:
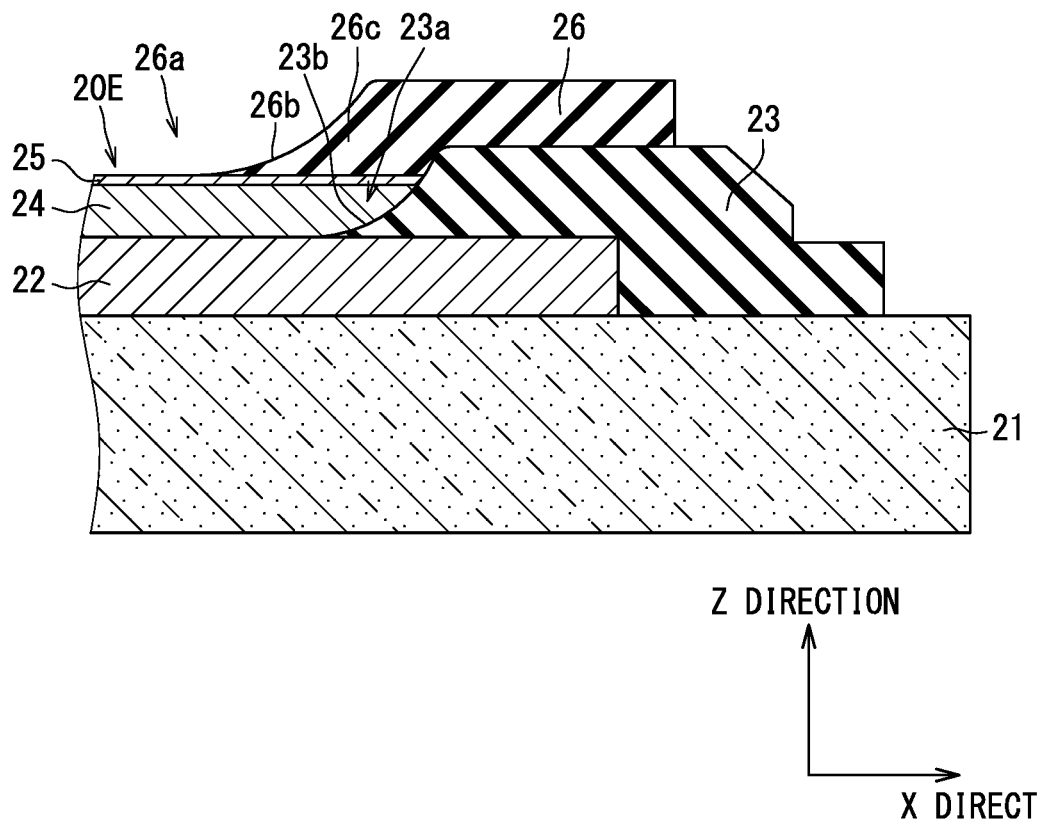
FIG. 4 is a diagram illustrating a cross-sectional view taken along a line IV-IV in FIG. 3.
Figure 5:
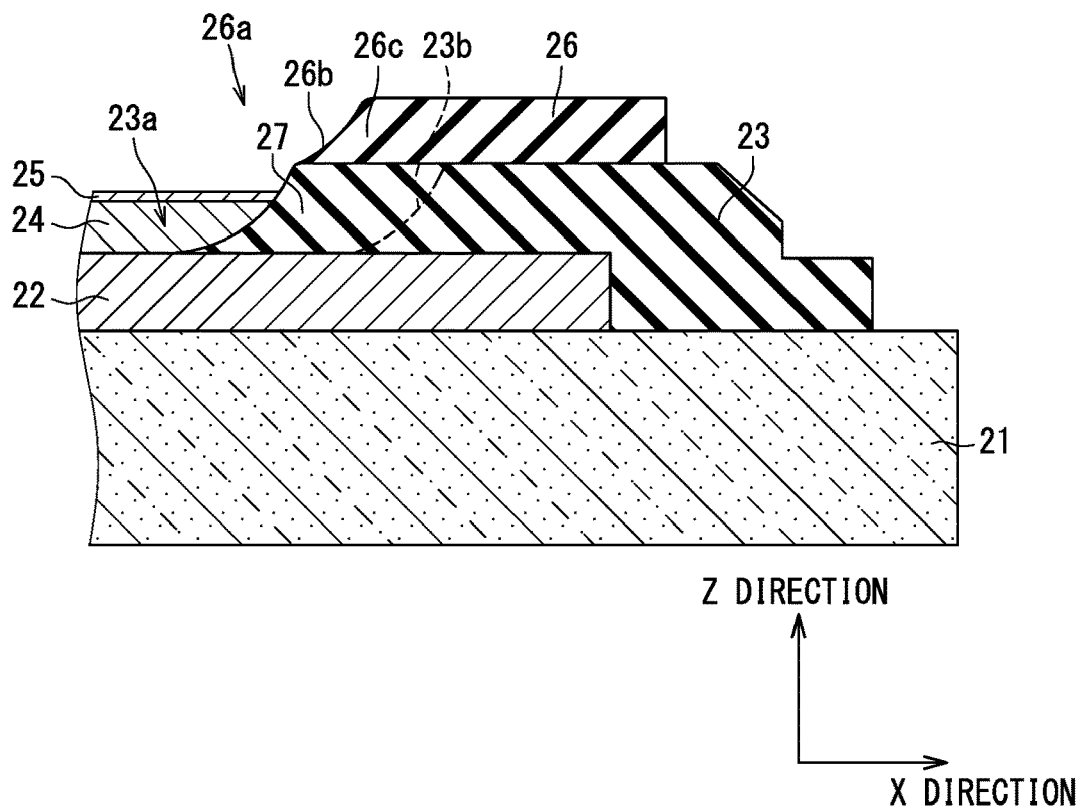
FIG. 5 is a diagram illustrating a cross-sectional view taken along a line V-V in FIG. 3.

As shown in FIGS. 3 to 5, the semiconductor chip 20 includes a semiconductor substrate 21, a first metal layer 22, a first protection film 23, a second metal layer 24, an oxidation inhibition layer 25, a second protection film 26, and an adhesion portion 27. In FIG. 3, in regard to the second protection film 26, only an opening edge 26b is illustrated with a dashed line.

The semiconductor substrate 21 has a generally rectangular shape as the planar shape. A surface layer of the one surface of the semiconductor substrate 21 has an active region (main region) and a peripheral region surrounding the active region. The active region is formed with emitter regions, a trench gate, an anode region of the FWD and the like. The peripheral region surrounding the active region is formed with a voltage-withstand structural part, such as a guard ring. A surface layer of the back surface of the semiconductor substrate 21 opposite to the one surface is formed with a collector region of the IGBT and a cathode region of the FWD.

On the one surface of the semiconductor substrate 21, the above described emitter electrode 20E and pads 20P are formed. The emitter electrode 20E is made of the first metal layer 22, the second metal layer 24 and the oxidation inhibition layer 25. In the present embodiment, the pads 20P have similar structures to the emitter electrode 20E. The semiconductor chip 20 has five pads 20P. However, the number of the pads 20P is not specifically limited.

The first metal layer 22 is formed on the one surface of the semiconductor substrate 21. For example, the first metal layer 22 is made of a material containing aluminum (Al) as a main component. In the present embodiment, the first metal layer 22 is made of AlSi, and is formed by sputtering. For example, the first metal layer 22 has a thickness of approximately 5 micrometers ($\mu$m). The first metal layer 22 may also be referred to as a base electrode or a lower electrode.

The first protection film 23 is formed on the one surface of the semiconductor substrate 21 so as to cover at least an end portion of the first metal layer 22. The end portion means a predetermined region from an end surface. The first protection film 23 is patterned so as to have an opening 23a on the first metal layer 22. The opening 23a corresponds to a first opening. The opening 23a is defined by an opening edge 23b as an inner end surface of the first protection film 23. The opening shape of the opening 23a is a generally rectangular shape as the planar shape. In the present embodiment, the first protection film 23 is made of a polyimide, and is formed by spin coating. For example, the first protection film 23 has a thickness of approximately 10 $\mu$m at a position without overlapping with the first metal layer 22.

The second metal layer 24 is formed on the first metal layer 22 in the opening 23a for the purposes of improving bonding strength with the colder 80 and enhancing wettability of the solder 80. The second metal layer 24 is made of a material containing nickel (Ni) as a main component, for example. The bonding strength with the solder can be improved by using Ni. Ni is a metal material harder than Al of the first metal layer 22.

In the present embodiment, the second metal layer 24 is provided by a plating film. Specifically, the second metal layer 24 is provided by an electroless plating film that contains Ni as the main component and phosphorous (P). The second metal layer 24 has a thickness of approximately several micrometers, for example. The second metal layer 24 may also be referred to as an upper base electrode or a top electrode.

The oxidation inhibition layer 25 is provided in order to inhibit oxidation of the second metal layer 24 before the second metal layer 24 is soldered. The oxidation inhibition layer 25 may further have a function of improving wettability of the solder 80. The oxidation inhibition layer 25 is formed on the second metal layer 24 in the opening 23a. For example, the oxidation inhibition layer 25 is made of Au.

In the present embodiment, as the oxidation inhibition layer 25, a plating film made of Au as a main component is used. Au of the oxidation inhibition layer 25 dispersed into the solder during the solder bonding. Therefore, the oxidation inhibition layer 25 exists before the solder bonding, but does not exist in the state after the solder bonding.

The second metal layer 24 and the oxidation inhibition layer 25 are formed with using the first protection film 23 as a mask. In the view projected in the Z direction, a formation area where the second metal layer 24 is formed and a formation area where the oxidation inhibition layer 25 is formed substantially coincide with each other.

The second protection film 26 is formed to cover at least an end portion of the oxidation inhibition layer 25 and the first protection film 23. The second protection film 26 is patterned to have an opening 26a. As the second protection film 26 has the opening 26a, the oxidation inhibition layer 25 is exposed from the opening 26a. The opening 26a corresponds to a second opening. The opening 26a is defined by an opening edge 26b as an inner end surface of the second protection film 26. The opening shape of the opening 26a is a generally rectangular shape as the planar shape. In the present embodiment, the second protection film 26 is made of polyimide, and is formed by spin coating. The second protection film 26 may be formed by any ways other than the spin coating, such as by using an ink-jet or a dispenser.

The second protection film 26 extends from a position over the oxidation inhibition layer 25 and covers a part of the first protection film 23. The second protection film 26 is formed so as to cover at least the end portion of the second metal layer 24. The opening area of the opening 26a is smaller than the opening area of the opening 23a. The second protection film 26 has an opening peripheral portion 26c. The opening peripheral portion 26c is a portion around the opening 26a. The opening peripheral portion 26c is a predetermined area from the opening edge 26b, and, specifically a portion on an inner side of the opening edge 23b.

The adhesion portion 27 has an adhesion property with the second protection film 26 stronger than that of the oxidation inhibition layer 25 with the second protection film 26. The adhesion portion 27 is located directly under the opening peripheral portion 26c of the second protection film 26. Specifically, the adhesion portion 27 is formed at the location overlapping with the opening peripheral portion 26c in the projection view projected in the Z direction. The adhesion portion 27 is in closely contact with a part of the lower surface of the opening peripheral portion 26c.

The adhesion portion 27 is formed at a position different from the oxidation inhibition layer 25 in a region directly underneath the opening peripheral portion 26c. That is, the adhesion portion 27 and the oxidation inhibition layer 25 are formed to be aligned with each other. The adhesion strength between the second protection film 26 and the adhesion portion 27 is higher than the adhesion strength between the second protection film 26 and the oxidation inhibition layer 25. Therefore, the adhesion portion 27 serves as an anchor of the opening peripheral portion 26c.

In the present embodiment, the semiconductor chip 20 is formed with a plurality of the adhesion portions 27. The plurality of adhesion portions 27 are formed so as to be in contact with a part of the opening peripheral portion 26c at plural position. The plurality of adhesion portions 27 are spaced apart from each other in a direction along a perimeter of the opening peripheral portion 26c. In the present disclosure, the "direction along the perimeter of the opening peripheral portion" corresponds to a direction along the perimeter of the opening defined by the opening peripheral portion.

The opening peripheral portion 26c has a generally rectangular loop shape as the planar shape. The adhesion portions 27 are formed on respective sides of the opening peripheral portion 26c, the respective sides connecting respective four corners of the opening peripheral portion 26c. On the respective four sides, the adhesion portions 27 are arranged at a predetermined interval. For example, four adhesion portions 27 are arranged on each of the four sides. In between adjacent adhesion portions 27, the second protection film 26 is disposed on the end portion of the second metal layer 24 with the oxidation inhibition layer interposed between the second protection film 26 and the end portion of the second metal layer 24. If there is no separation occurred in a state before the solder bonding, the oxidation inhibition layer 25 is in contact with the lower surface of the opening peripheral portion 26c.

The adhesion portions 27 are provided as portions of the first protection film 23. As shown in FIGS. 3 and 5, the adhesion portions 27 are projections inwardly extending from the opening edge 23b of the first protection film 23. The first protection film 23 and the second protection film 26 are both passivation films (insulating films). Thus, the adhesion strength between the adhesion portions 27 and the second protection film 26 is high. In the present embodiment, the first protection film 23 and the second protection film 26 are made of a polyimide as the same material. In this case, the adhesion strength further improves.

The projections as the adhesion portions 27 are arranged at a predetermined pitch on each of the four sides. Under the opening peripheral portion 26c, the adhesion portions 27 are arranged directly under the opening peripheral portion 26c only in regions where the adhesion portions 27 are extended, and the end of the oxidation inhibition layer 25 is arranged in a remaining region. The adhesion portions 27 each have a generally rectangular shape as the planar shape.

(Solder Bonding Structure)

Figure 6:
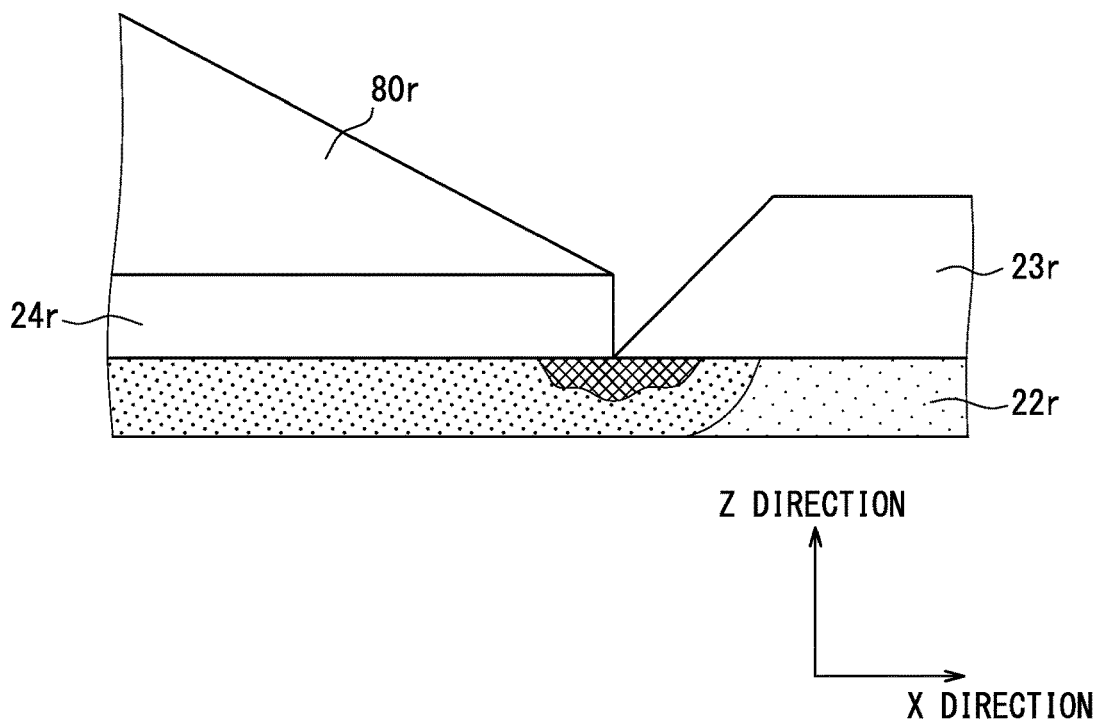
FIG. 6 is a diagram illustrating a stress distribution in a reference example.

FIG. 6 is a diagram illustrating a stress distribution applied to a first metal layer in a reference example without having a second protection film. FIG. 6 shows a simulation result. In FIG. 6, elements relating to elements of the present embodiment are designated with reference numbers with "r" as suffixes.

As shown in FIG. 6, thermal stress of a power cycle or a thermal cycle concentrates on a part of a first metal layer 22r directly under a boundary between a first protection film 23r and a second metal layer 24r, that is, directly under an end surface of the second metal layer 24r. In this case, therefore, a crack is likely to occur in the first metal layer 22r at a position corresponding to the boundary. Note that the thermal stress is caused by a difference of coefficient of linear expansion between a semiconductor substrate (element) and a metal member such as a terminal.

Figure 7:
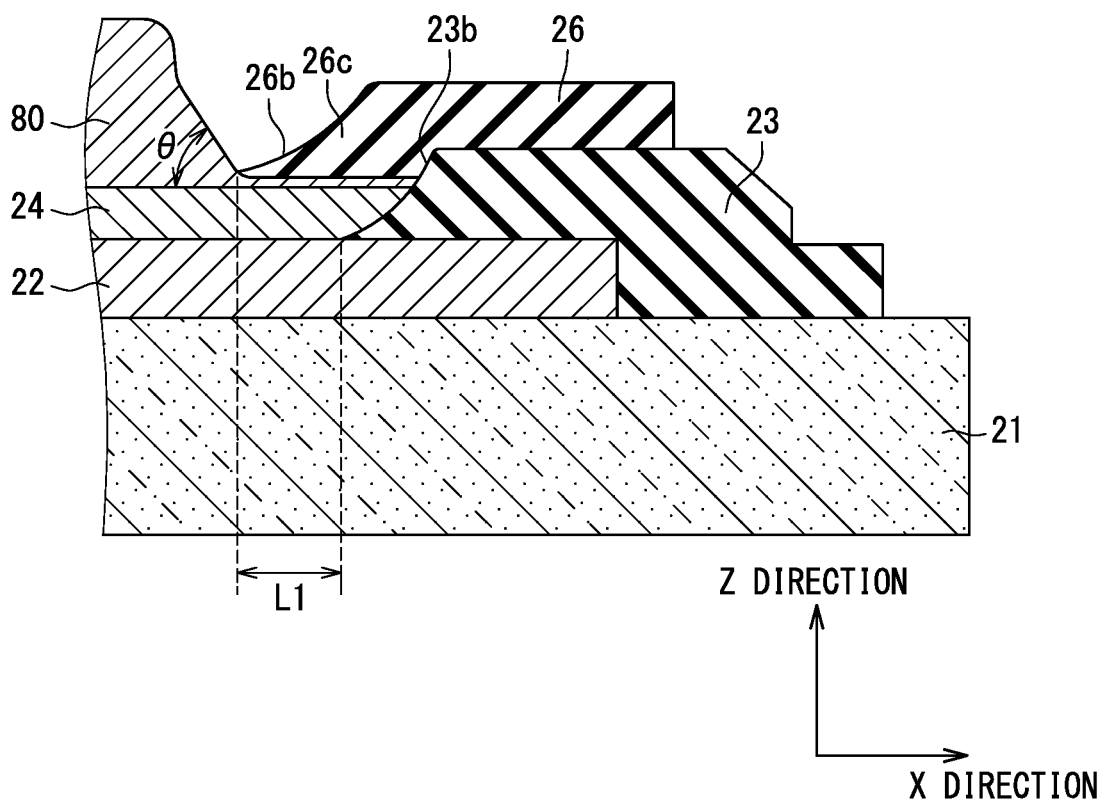
FIG. 7 is a diagram illustrating a cross-sectional view in a solder bonded state.
Figure 8:
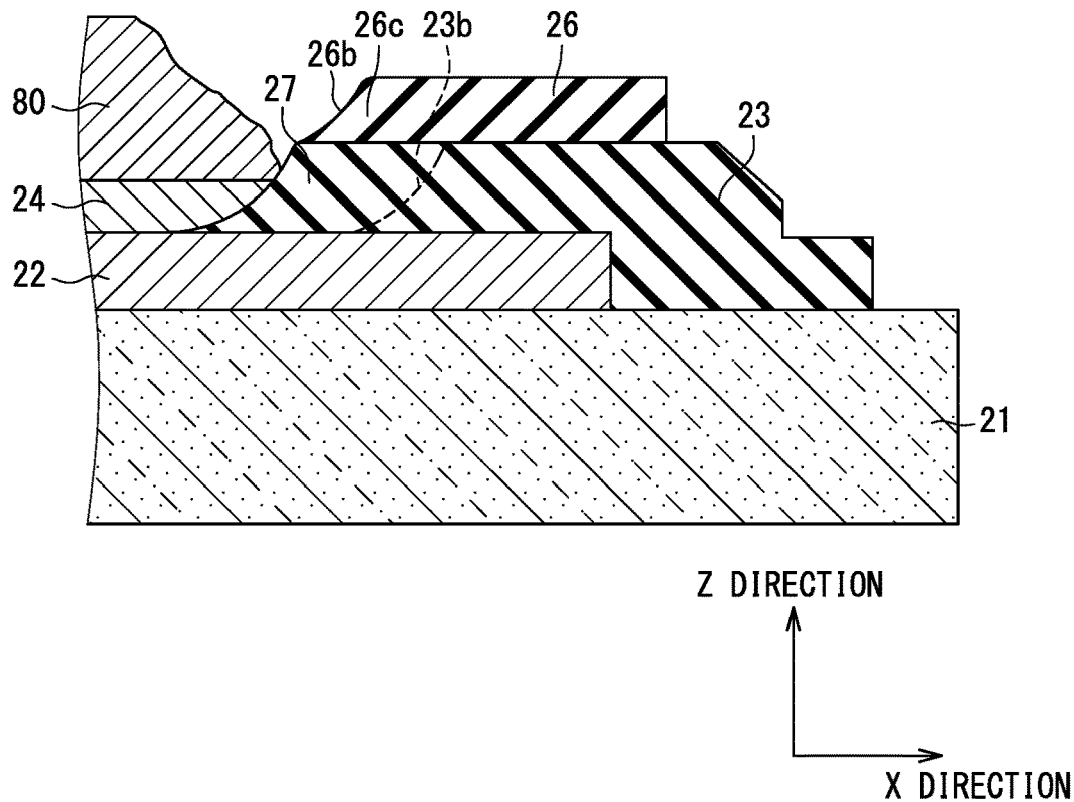
FIG. 8 is a diagram illustrating a cross-sectional view in a solder bonded state.

FIG. 7 illustrates the portion of the semiconductor chip 20 shown in FIG. 4, but after the solder bonding. FIG. 8 illustrates the portion of the semiconductor chip 20 shown in FIG. 5, but after the solder bonding. Note that, in FIGS. 7 and 8, illustrations of terminals 40 as objects to be connected are omitted.

The semiconductor chip 20 (semiconductor device 10) of the present embodiment further has the second protection film 26 and the adhesion portions 27, differently from the reference example described above. Further, the adhesion portions 27 serve as anchors of the second protection film 26. For this reason, it is less likely that the opening peripheral portion 26c of the second protection film 26 will be separated from the oxidation inhibition layer 25 due to the change in temperature during a manufacturing process, or the like.

Even if a portion of the opening peripheral portion 26c where the adhesion portion 27 is not formed is separated from the oxidation inhibition layer 25, the separated portion can be held on the end portion of the oxidation inhibition layer 25 by the adhesion portions 27 serving as the anchors. In particular, Au of the oxidation inhibition layer 25 has a poor adhesion property relative to the polyimide of the second protection film 26, and the oxidation inhibition layer 25 thus will be easily separated from the second protection film 26. However, even if the second protection film 26 is separated, the separated portion of the opening peripheral portion 26c can be held on the end portion of the oxidation inhibition layer 25 by the adhesion portions 27 as the anchors.

As described above, the opening peripheral portion 26c can be held on the end portion of the oxidation inhibition layer 25, the second protection film 26 can restrict the solder 80 from wetting and spreading over the end portion of the second metal layer 24.

For example, in a case where at least a portion of the opening peripheral portion 26c where the adhesion portions 27 are not formed is separated, since the separated portion of the opening peripheral portion 26c is held on the end of the second metal layer 24, a gap into which a solder wets and spreads is small. As shown in FIG. 7, therefore, the thickness of the solder 80 wetted and spread over the end of the second metal layer 24 can be reduced.

It is conceivable that at least a portion of the oxidation inhibition layer 25 in a region directly under the opening peripheral portion 26c may diffuse into the solder 80 via a lower end of the opening edge 26b, even if the separation has not occurred in the opening peripheral portion 26c in a state immediately before the solder bonding. That is, it is conceivable that the solder 80 may wet and spread to at least a portion of the region directly under the opening peripheral portion 26c and above the second metal layer 24 where the adhesion portions 27 are not provided. In this way, the solder 80 is likely to enter and cause the separation due to the diffusion. However, even if all of the oxidation inhibition layer 25 in the region directly under the opening peripheral portion 26c is diffused into the solder 80, a gap between the opening peripheral portion 26c and the second metal layer 24 is small. Therefore, the thickness of the solder 80 above the end of the second metal layer 24 can be kept small, as shown in FIG. 7.

Accordingly, in the semiconductor chip 20 (semiconductor device 10) of the present embodiment, the wetting and spreading of the solder 80 up to the end surface of the second metal layer 24 can be restricted, and thus the occurrence of crack in the first metal layer 22 can be suppressed. In addition, since the adhesion portions 27 are partially provided relative to the opening peripheral portion 26c, the degradation of heat radiation performance can be suppressed.

In the regions where the adhesion portions 27 are formed, the second protection film 26 does not cover the oxidation inhibition layer 25 and the second metal layer 24, as show in FIG. 5. As shown in FIG. 8, therefore, the solder 80 wets and spreads up to the end surface of the second metal layer 24. However, the adhesion portions 27 are not provided entirely along the perimeter of the opening peripheral portion 26c, but are partially provided. In this way, since the adhesion portions 27 are partially (locally) formed relative to the opening peripheral portion 26c, the stress concentration to the first metal layer 22 can be suppressed, and further the occurrence of cracks can be suppressed. In the present embodiment, particularly, the plurality of adhesion portions 27 are separately arranged along the perimeter of the opening peripheral portion 26c. Therefore, the stress concentration can be suppressed while ensuring the anchor effect. In addition, the opening peripheral portion 26c can be widely held on the end portion of the oxidation inhibition layer 25.

For example, in a case where the semiconductor substrate is made of SiC, the width of the voltage withstand structural part on the outer periphery is defined with a necessary creepage distance. Therefore, in a conventional structure, it was difficult to design the voltage withstand structural part on the outer periphery with the width calculated by the essential characteristic of SiC, and the area of the element was unnecessarily increased. In the present embodiment, the second protection film 26 is stacked on the first protection film 23. In this case, since the protection film above the voltage withstand structural part is reduced in thickness, the necessary creepage distance is reduced, and the area of the element can reduced.

In the present embodiment, the adhesion portions 27 are provided as portions of the first protection film 23. Since the first protection film 23 and the second protection film 26 are both passivation films (insulating films), the adhesion strength between the adhesion portions 27 and the second protection film 26 can be increased. Further, since the adhesion portions 27 are provided as the portions of the first protection film 23, the structure can be simplified as well as the manufacturing process can be simplified. Furthermore, since the adhesion portions 27 are held by the first protection film 23, the separation of the adhesion portions 27 can be suppressed.

In the present embodiment, the opening peripheral portion 26c has a generally rectangular loop shape as the planar shape, and the adhesion portions 27 are provided corresponding to the sides of the opening peripheral portion 26c. Since the temperature becomes higher toward the center of the element, the sides have a higher temperature than the corner portions due to heat generation of the element. In this way, the adhesion portions 27 are provided in regions severely affected by the heat generated from the element. Therefore, the separation of the opening peripheral portion 26c can be suppressed. Further, even if the opening peripheral portion 26c is peeled off by the heat, it can be held on the end portion of the second metal layer 24.

In the present embodiment, as shown in FIG. 7, an overlap length L1 of the second protective film 26 with respect to the opening edge 23b of the first protection film 23 is set to 30 µm or more in the region where the contact portion 27 is not provided. The overlap length L1 is the length from the lower end of the opening edge 23b of the first protection film 23 to the lower end of the opening edge 26b of the second protection film 26 in a planar direction. In this case, an angle formed by the solder 80 with respect to the surface of the second metal layer 24 is defined as a fillet angle θ.

Figure 9:
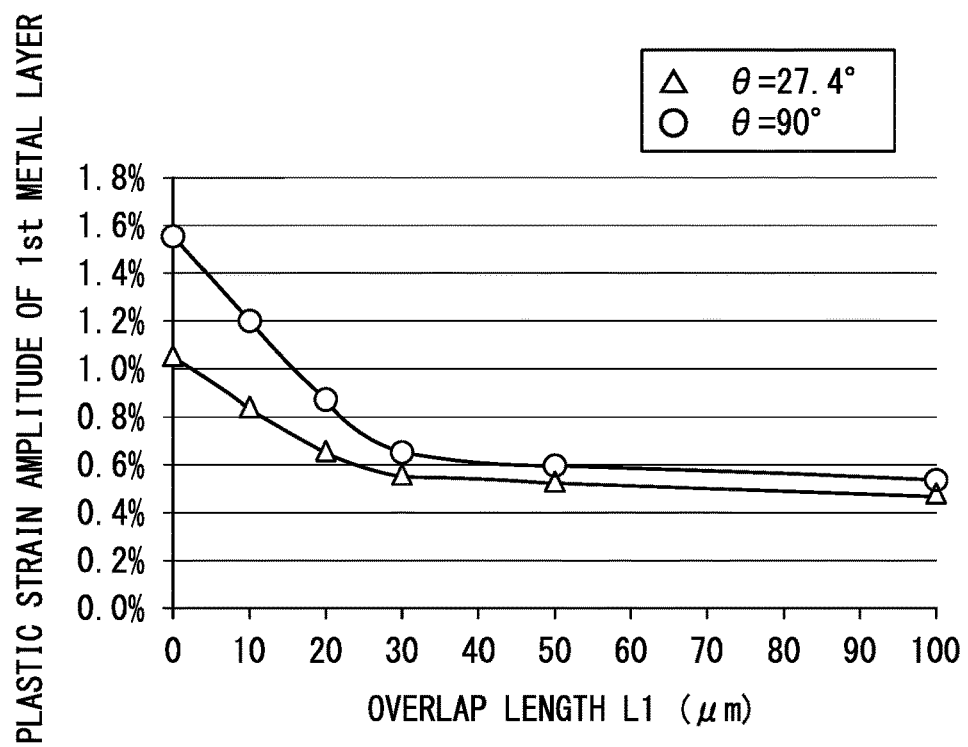
FIG. 9 is a diagram illustrating a relationship between an overlap length and a plastic strain amplitude of a first metal layer.

FIG. 9 is a diagram illustrating the relationship between the overlap length L1 and the plastic strain amplitude of the first metal layer 22. FIG. 9 shows a simulation result. In this case, the plastic strain amplitude is a plastic strain amplitude corresponding to Al directly under the end surface of the second metal layer 24 in the first metal layer 22. In FIG. 9, a triangle symbol (Δ) indicates the result of the fillet angle being 27.4 degrees (θ=27.4), and a circle symbol (○) indicates the result of the fillet angle being 90 degrees (θ=90).

According to FIG. 9, it is appreciated that, when the overlap length L1 is 30 µm or more, the plastic strain amplitude of the first metal layer 22 can be reduced regardless of the fillet angle θ of the solder 80, that is, the stress acting on the first metal layer 22 can be reduced. Although not illustrated, the same effect can be obtained even when the fillet angle θ is an obtuse angle larger than 90 degrees. In the present embodiment, as described above, since the overlap length L1 of the second protective film 26 with respect to the opening edge 23b of the first protective film 23 is 30 µm or more in the entire perimeter of the opening peripheral potion 26c, the stress applied to the first metal layer 22 can be effectively reduced. As a result, it is possible to effectively suppress the occurrence of cracks in the first metal layer 22.

As described above, in the regions where the adhesion portions 27 are formed, the solder 80 wets and spreads to the end surface of the second metal layer 24. However, since the overlap length L1 is 30 µm, the occurrence of cracks in the first metal layer 22 can be effectively suppressed.

In the present embodiment, the overlap length L1 is 0.65 mm or less. In a case where the overlap length L1 exceeds 0.65 mm, the location at which the temperature is the highest in the element shifts from a center part of the element to the peripheral part of the element. In the case where the overlap length is 0.65 mm or less, the location at which the temperature is the highest can be set in the center part of the element. For this reason, it is less likely that the opening peripheral portion 26c of the second protective film 26 will be easily separated due to the heat of the element being the highest in the peripheral part of the element. In addition, since the center part of the element that is not covered with the second protection film 26 has the highest temperature, it is possible to suppress the degradation in heat dissipation due to the provision of the second protective film 26.

In the above example, four adhesion portions 27 are provided on each of the sides. However, the arrangements of the adhesion portions 27 are not limited to the above example.

The planar shape of the adhesion portion 27 is not limited to the example described above. The adhesion portions 27 may have any shapes as long as the adhesion portions 27 can ensure the adhesive force for holding the second protection film 26. As a first modification shown in FIG. 10, the adhesion portions 27 may each have substantially a triangular shape as the planar shape. In the case where the adhesion portions 27 have substantially the triangular shape as the planar shape, the areas of the adhesion portions 27 can be smaller than those having substantially the rectangular shape as the planar shape if the extending length of the triangular adhesion portions 27 and the extending length of the rectangular adhesion portions 27 from the opening edge 23b are equal. As a result, it is possible to suppress the degradation of heat radiation due to the adhesion portions 27 being provided, while suppressing the separation.

Figure 10:
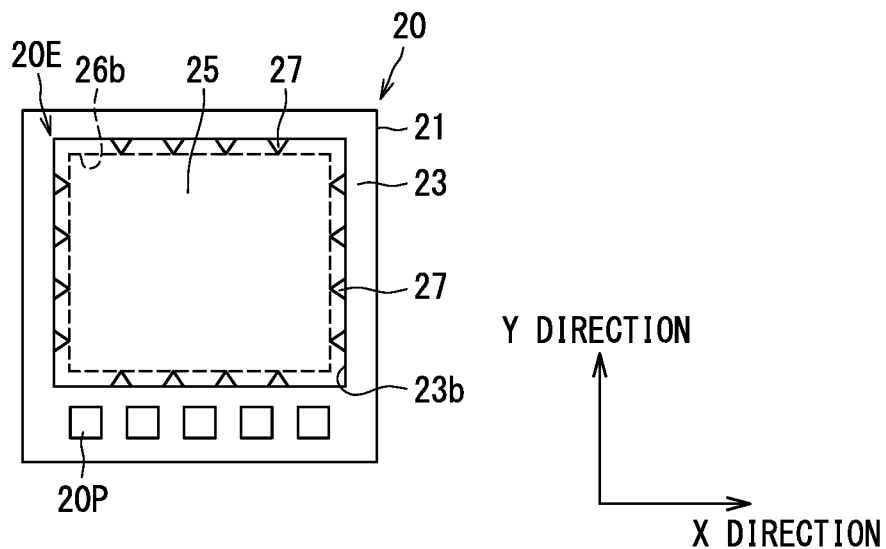
FIG. 10 is a diagram illustrating a plan view of a semiconductor chip of a first modification, and corresponding to FIG. 3.
Figure 11:
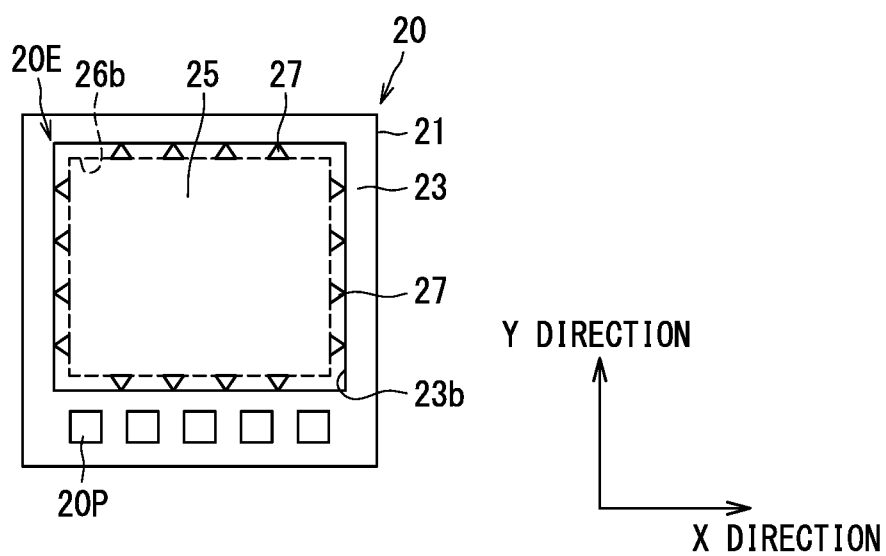
FIG. 11 is a diagram illustrating a plan view of a semiconductor chip of a second modification, and corresponding to FIG. 10.

As a second modification shown in FIG. 11, the adhesion portions 27 may have a generally triangular shape that has an apex on the opposite side to that of the first modification shown in FIG. 10. That is, the adhesion portions 27 may have the generally triangular shape whose width increases as a function of distance from the opening edge 23b of the first protection film 23 toward its end. The separation of the opening peripheral portion 26c begins from the opening edge 26b. In the second modification shown in FIG. 11, the width of the adhesion portion 27 is wider on a side adjacent to the opening edge 26b. Therefore, it is possible to effectively suppress the separation of the opening peripheral portion 26c, while suppressing the degradation of the heat radiation, similarly to the first modification. In addition to the examples described above, the adhesion portions 27 may have a generally circular shape, a generally elliptical shape, a generally trapezoidal shape plane, or the like as the planar shape.

Second Embodiment

The present embodiment can refer to the preceding embodiment. Therefore, the descriptions of the parts common to those in the semiconductor device 10 and the semiconductor chip 20 of the preceding embodiment will be omitted.

Figure 12:
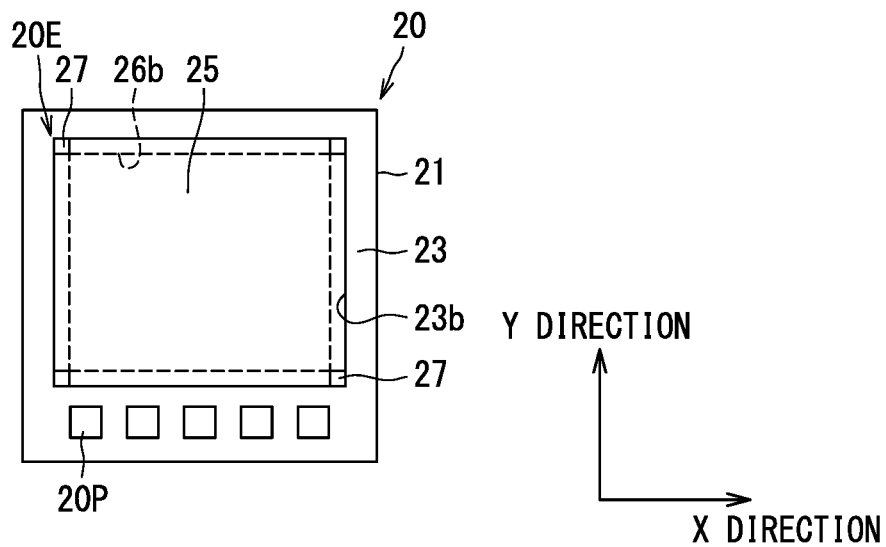
FIG. 12 is a diagram illustrating a semiconductor chip of a semiconductor device according to a second embodiment, and corresponding to FIG. 10.

Also in the semiconductor chip 20 of the present embodiment, the opening peripheral portion 26c has a generally rectangular loop shape as the planar shape. Further, as shown in FIG. 12, a plurality of adhesion portions 27 are provided at positions corresponding to the corners of the opening peripheral portion 26c. In FIG. 12, the adhesion portions 27 are individually provided at the four corners. The adhesion portions 27 are provided only are the corners and are not provided on the sides connecting the corners.

Thermal stress is more likely to concentrate to the corners than to the sides. On the other hand, since the temperature of the element is higher in the center part, the corners, which are located farther than the sides from the center part, are less important than the sides in terms of heat radiation. Therefore, even in a structure where the adhesion portions 27 are provided at the corners and hence the solder 80 is not arranged at the corners, it is possible to suppress the occurrence of cracks in the first metal layer 22, while suppressing the degradation of the heat radiation due to the adhesion portions 27 being provided.

In FIG. 12, the example in which the adhesion portions 27 are provided on all four corners is indicated. However, the second embodiment is not limited to the example shown in FIG. 12. The adhesion portions 27 may be provided so as to correspond to at least one of the plurality of corners.

Figure 13:
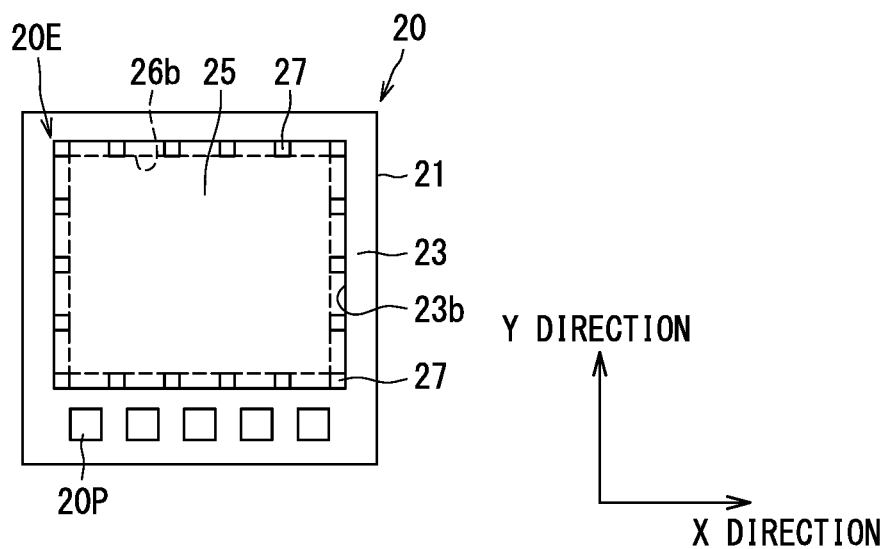
FIG. 13 is a diagram illustrating a plan view of a semiconductor chip according to a third modification, and corresponding to FIG. 12.

As in a third modification shown in FIG. 13, the adhesion portions 27 may be provided on both of the corners and the sides. In the example of FIG. 13, the adhesion portions 27 are provided at the four corners, respectively. Further, the plurality of adhesion portions 27 are provided on each of the four sides. In such a configuration, the separation of the opening peripheral portion 26c of the second protection film 26 can be effectively suppressed. Further, even if the separation occurs, the opening peripheral portion 26c can be held more reliably.

Third Embodiment

The present embodiment can refer to the preceding embodiment. Therefore, the descriptions of the parts common to those in the semiconductor device 10 and the semiconductor chip 20 of the preceding embodiment will be omitted.

Figure 14:
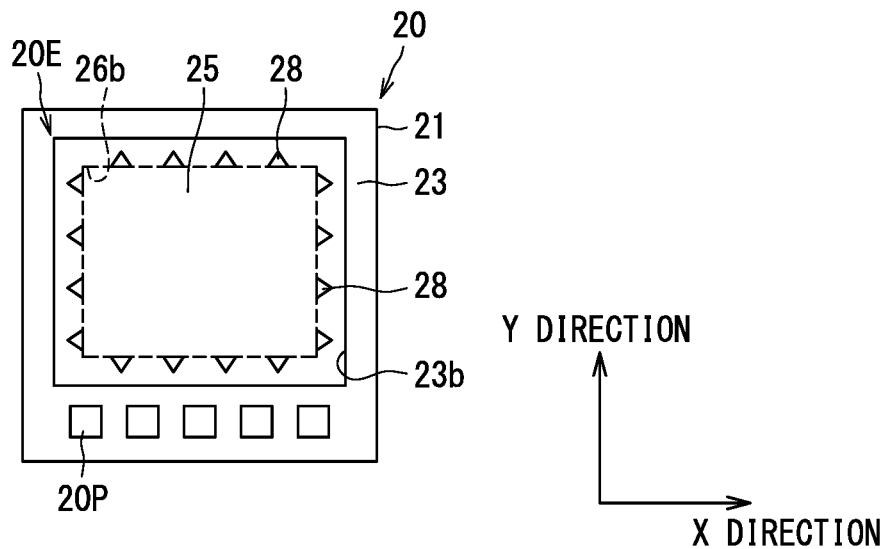
FIG. 14 is a diagram illustrating a plan view of a semiconductor chip of a semiconductor device according to a third embodiment, and corresponding to FIG. 3.

Also in the semiconductor chip 20 of the present embodiment, the opening peripheral portion 26c has a generally rectangular loop shape as the planar shape. As shown in FIG. 14, adhesion portions 28 are formed on the first metal layer 22 at positions away from the opening edge 23b of the first protection film 23. The adhesion portions 28 are not continuous to the first protection film 23. The adhesion portions 28 are made of the same material as the first protective film 23, similarly to the preceding embodiments.

Such adhesion portions 28 are formed in the same step as the first protection film 23, for example, by patterning a polyimide film. For this reason, the adhesion portions 28 have an adhesion property higher than the oxidation inhibition layer 25 relative to the second protection film 26 and thus serve as the anchors, similarly to the adhesion portions 27 of the preceding embodiments.

Similarly to the adhesion portions 27 of the second modification shown in FIG. 11, the adhesion portions 28 have the generally triangular shape, as the planar shape, whose width increases as the function of distance from the opening edge 23b. Further, the positions of the inner ends of the adhesion portions 28, that is, the ends on the wide side substantially coincide with the opening edge 26b.

According to the present embodiment, the adhesion portions 28 are formed at positions away from the opening edge 23b of the first protective film 23. Therefore, if the overlap length L1 is the same between the adhesion portions 27 and the adhesion portions 28, the area occupied by the adhesion portions 28 can be reduced as compared with the adhesion portions 27. Therefore, it is possible to effectively suppress the opening peripheral portion 26c from being separated from the opening edge 26b while suppressing the degradation of the heat radiation.

In particular, in the present embodiment, the width of the adhesion portions 28 is wider on the side adjacent to the opening edge 26b of the second protection film 26. Therefore, it is possible to more effectively suppress the separation of the opening peripheral portion 26c, while suppressing the degradation of the heat radiation.

Similarly to the adhesion portions 27, the planar shape of the adhesion portions 28 is not limited to the example described above. Also, the arrangement of the adhesion portions 28 is not limited to the example described above. The adhesion portions 28 may be provided at least one of the corners, or may be arranged on the sides, similarly to the adhesion portions 27. The adhesion portions 28 may be arranged on both of the corners and the sides.

Fourth Embodiment

The present embodiment can refer to the preceding embodiment. Therefore, the descriptions of the parts common to those in the semiconductor device 10 and the semiconductor chip 20 of the preceding embodiment will be omitted.

Figure 15:
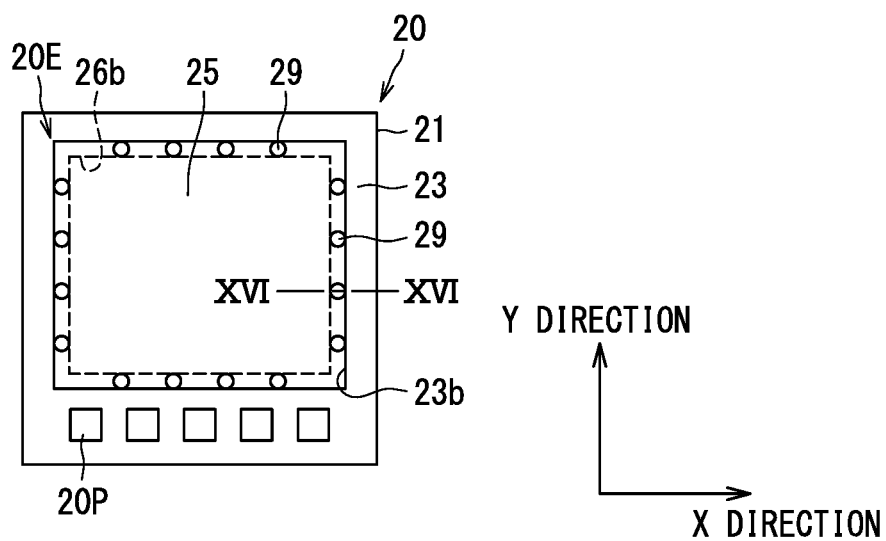
FIG. 15 is a diagram illustrating a plan view of a semiconductor chip of a semiconductor device according to a fourth embodiment, and corresponding to FIG. 3.
Figure 16:
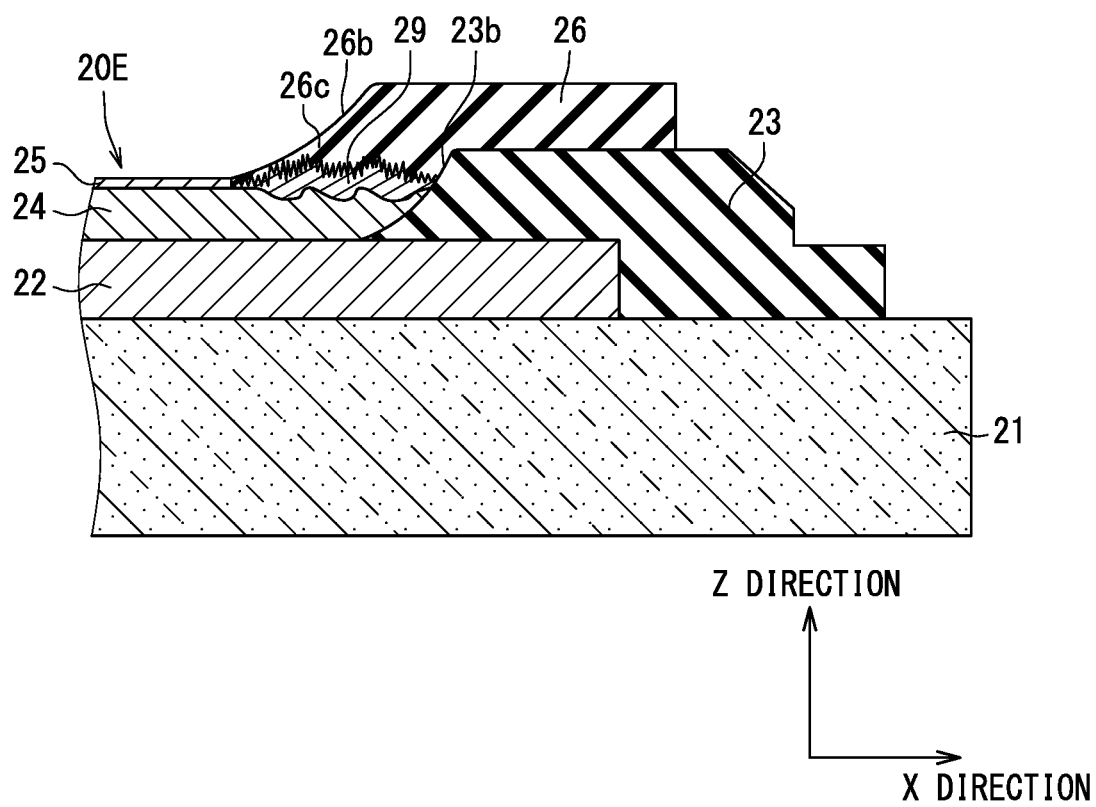
FIG. 16 is a diagram illustrating a cross-sectional view taken along a line XVI-XVI in FIG. 15.

Also in the semiconductor chip 20 of the present embodiment, the opening peripheral portion 26c has a generally rectangular loop shape as the planar shape. As shown in FIGS. 15 and 16, the adhesion portions 29 are provided by rough portions formed on the second metal layer 24 and containing an oxide of the same metal as the metal of the main component of the second metal layer 24. In the present embodiment, the main component of the adhesion portions 29 is an oxide of Ni.

The adhesion portions 29 are formed by applying a pulsed laser beam on a portion of the end of the oxidation inhibition layer 25 after forming the oxidation inhibition layer 25 and before forming the second protection film 26. When the laser light is applied, Au of the oxidation inhibition layer 25 is removed, and the surface layer portion of the second metal layer 24 under the oxidation inhibition layer 25 is melted and vaporized. Thus, a rough oxide film as an oxide layer of Ni of the main component of the second metal layer 24 is formed on the surface of the second metal layer 24. The rough oxide film has continuous projections and recesses on its surface. The rough oxide film provides the adhesion portion 29.

Depending on the length of the adhesion portions 29, only one pulse or a plurality of pulses may be applied to each of the adhesion portions 29.

According to the present embodiment, as the adhesion portions 29, the rough oxide films each having very fine projections and recesses on its surface are formed. Therefore, the second protection film 26 is entangled with the projections on the surface of the adhesion portions 29. Further, the contact area with the second protection film 26 increases. Thus, the adhesion portions 29 serves as the anchors. Accordingly, the separation of the opening peripheral portion 26c of the second protection film 26 can be suppressed. Further, even if a portion of the opening peripheral portion 26c where the adhesion portions 29 are not formed is separated, the portion separated can be held on the end portion of the oxidation inhibition layer 25. The adhesion portions 29 are partially formed relative to the opening peripheral portion 26c. Therefore, the degradation of the heat radiation can be suppressed. The oxide film has a low wettability with respect to the solder 80. Therefore, the wetting and spreading of the solder 80 can be also suppressed.

Note that the adhesion portions 29 may be provided in the entire area directly under the opening peripheral portion 26c of the second protection film 26. In this case, the solder 80 does not spread to the area directly under the opening peripheral portion 26c. That is, the solder 80 does not spread to the edge of the second metal layer 24. Therefore, it is possible to more effectively suppress the occurrence of cracks in the first metal layer 22.

Figure 17:
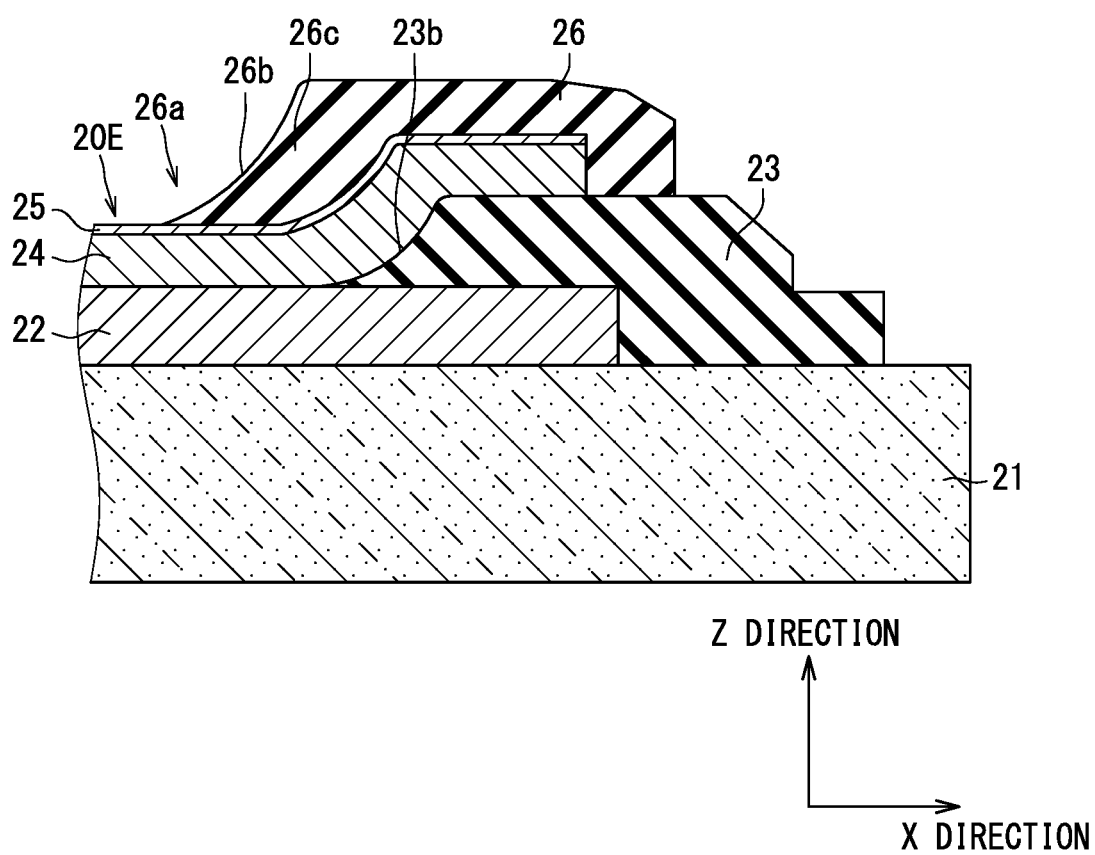
FIG. 17 is a diagram illustrating a cross-sectional view of a semiconductor chip of a fourth modification, and corresponding to FIG. 4.
Figure 18:
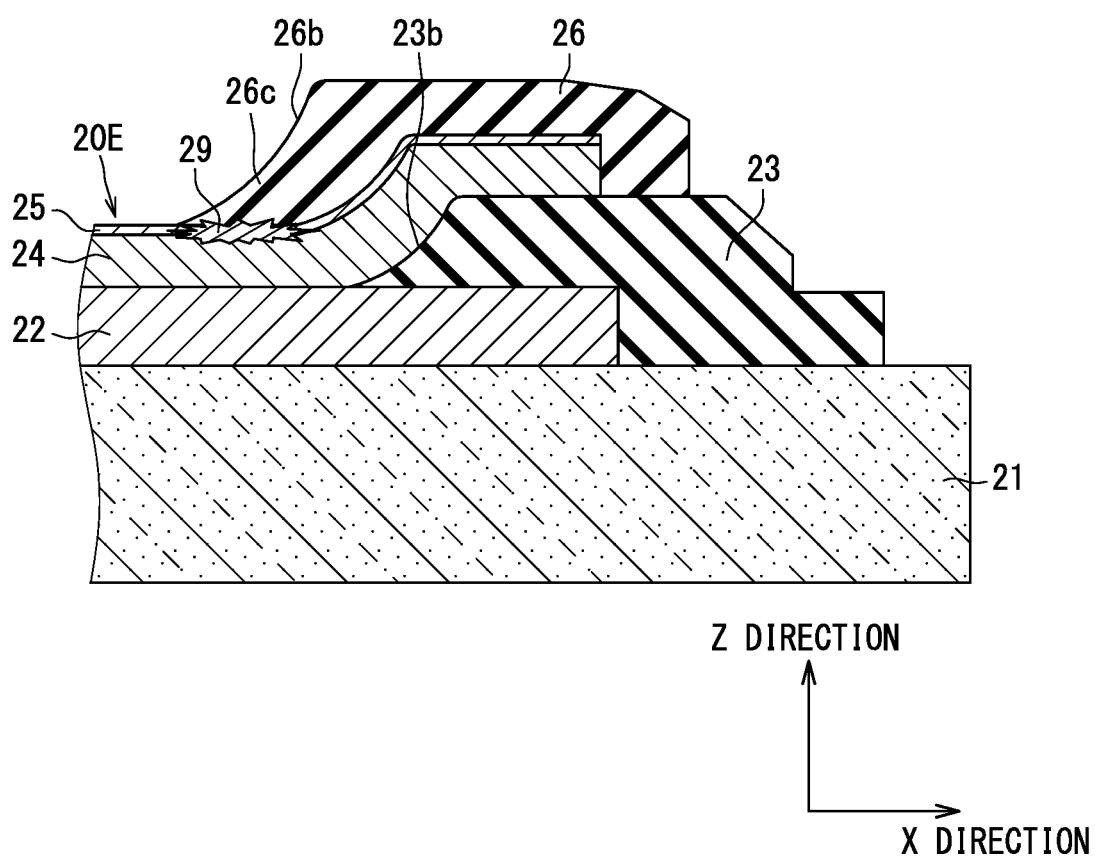
FIG. 18 is a diagram illustrating a cross-sectional view of the semiconductor chip of the fourth modification, and corresponding to FIG. 5.

Further, the adhesion portions 29 can be formed with respect to the second metal layer 24 and the oxidation inhibition layer 25 that are formed without using the first protection film 23 as a mask. For example, the adhesion portions 29 can be formed by irradiating the second metal layer 24 and the oxidation inhibition layer 25, which are formed by sputtering, with laser light. In this case, the second metal layer 24 and the oxidation inhibition layer 25 may be provided only in the opening 23a as in the preceding embodiments, or may be provided as in a fourth modification shown in FIGS. 17 and 18. In the fourth modification, the second metal layer 24 and the oxidation inhibition layer 25 are provided so as to cover a peripheral portion of the first protection film 23 forming the opening 23a. Also, the emitter electrode 20E and the pad 20P can be provided independently. For example, the pad 20P may not be provided with the second metal layer 24 and the oxidation inhibition layer 25, so that the first metal layer 22 is exposed. In FIG. 18, the adhesion portion 29 is illustrated in a simplified manner.

Fifth Embodiment

The present embodiment can refer to the preceding embodiment. Therefore, the descriptions of the parts common to those in the semiconductor device 10 and the semiconductor chip 20 of the preceding embodiment will be omitted.

Figure 19:
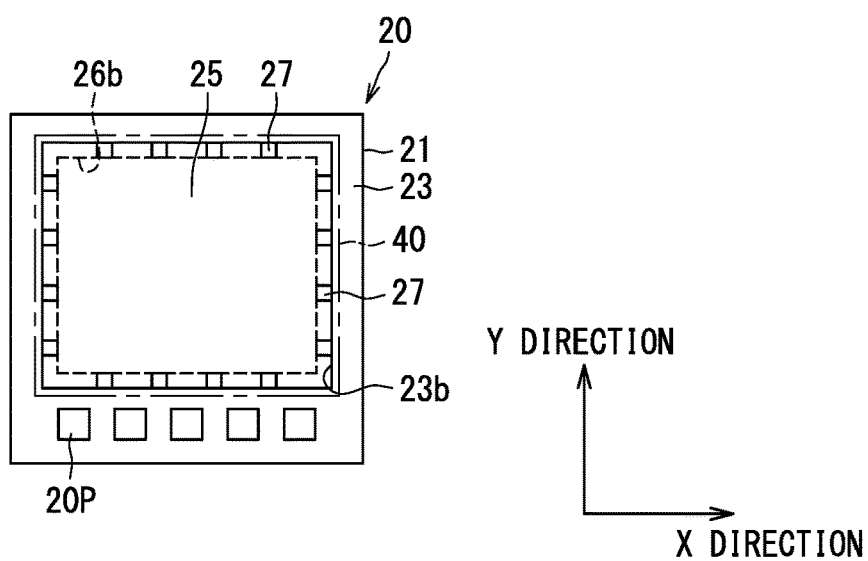
FIG. 19 is a diagram for illustrating a positional relationship between a semiconductor chip and a terminal according to a fifth embodiment.
Figure 20:
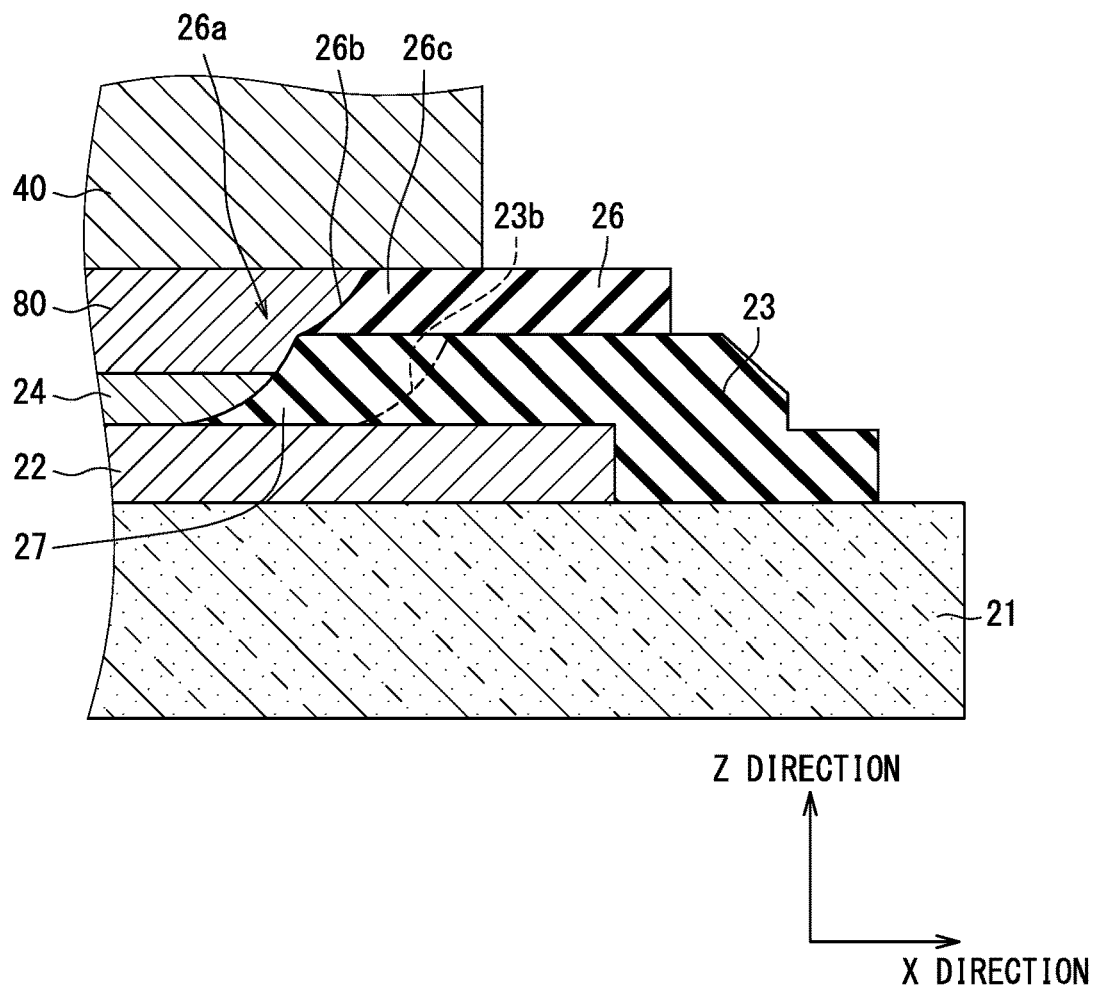
FIG. 20 is a diagram illustrating a cross-sectional view of the semiconductor chip according to the fifth embodiment, and corresponding to FIG. 8.

In the semiconductor device 10 of the present embodiment, as shown in FIGS. 19 and 20, a terminal 40 having a size larger than the opening 26a of the second protection film 26 is employed. The terminal 40 encloses the entirety of the opening 26a in a projection view projected in the Z direction. The area of the terminal 40 along the XY plane is larger than that of the opening 26a. In FIG. 19, the terminal 40 is shown by an alternate long and short dashed line. The terminal 40 corresponds to a metal member.

When such a terminal 40 is used, the fillet angle of the solder 80 becomes an obtuse angle, as shown in FIG. 20. The semiconductor chip 20 is the same as that of the first embodiment as shown in FIG. 19.

According to the present embodiment, the cross-sectional area of the path of the solder 80 and the terminal 40 is increased, so the heat radiation performance can be improved, for example. Further, even if the fillet angle of the solder 80 is obtuse, it is possible to suppress the occurrence of cracks in the first metal layer 22 by the anchor effect of the adhesion portions 27, as described in association with the preceding embodiments. In particular, when the overlap length L1 is 30 μm, it is possible to effectively suppress the occurrence of cracks in the first metal layer 22. Therefore, it is possible to suppress the occurrence of cracks in the first metal layer 22 while improving the heat radiation.

The structure of the semiconductor chip 20 is not limited to the one exemplified in the first embodiment. The semiconductor chip 20 may have the structure of the second embodiment, the third embodiment, the fourth embodiment, or the modifications.

Although the present disclosure has been described in accordance with the embodiments, it is understood that the present disclosure is not limited to such embodiments or structures. The present disclosure encompasses various modifications and variations within the scope of equivalents. Furthermore, various combination and formation, and other combination and formation including one, more than one or less than one element may be made in the present disclosure.

The structure of the semiconductor device 10 is not limited to the example described above. The semiconductor device 10 may include the semiconductor chip 20 at least.

In the embodiments and modifications described hereinabove, the semiconductor chip 20 has the emitter electrode 20E on the one surface and the collector electrode 20C on the back surface. However, the structure of the semiconductor chip 20 is not limited to the example described above. The semiconductor chip 20 may have the electrodes described above only on the one surface.

The planar shape of the opening peripheral portion 26c is not limited to the generally rectangular loop shape.

In the embodiments and modifications described hereinabove, the second protection film 26 does not cover the end portion of the oxidation inhibition layer 25 and the end portion of the second metal layer 24 in the region where the adhesion portions 27, 28 or 29 are formed. However, the present disclosure is not limited to such an example. The second protection film 26 may slightly cover the end portion of the oxidation inhibition layer 25 or the end potion of the second metal layer 24. However, the former structure in which the second protection film 26 does not cover the end portion of the oxidation inhibition layer 25 and the end portion of the second metal layer 24 is preferable in terms of the heat radiation performance and the electric characteristics.

In the embodiments and modifications described hereinabove, the plurality of adhesion portions 27, 28 or 29 are formed. However, the number of the adhesion portions 27, 28 or 29 is not limited to the examples described above, and may be at least one.

What is claimed is:

1. A semiconductor device comprising:
   a semiconductor substrate having an element;
   a first metal layer disposed on a surface of the semiconductor substrate;
   a first protection film defining a first opening above the first metal layer and covering an end portion of the first metal layer;
   a second metal layer disposed on the first metal layer in the first opening;
   an oxidation inhibition layer disposed on the second metal layer in the first opening;
   a second protection film defining a second opening and covering an end portion of the oxidation inhibition layer and the first protection film, the second protection film having an opening peripheral portion on a periphery of the second opening, the end portion of the oxidation inhibition layer being covered with the opening peripheral portion; and
   an adhesion portion adhering to a portion of a lower surface of the opening peripheral portion of the second protection film, the lower surface facing the end portion of the oxidation inhibition layer, an adhesive strength between the adhesion portion and the second protection film being higher than an adhesive strength between the oxidation inhibition layer and the second protection film, wherein
   the second protection film overlaps with the end portion of the second metal layer in a region where the adhesion portion is not provided, and has an overlap length, which begins from an opening edge of the first protection film defining the first opening toward inside of the second opening in a planar direction, of 30 micrometers or more.

2. The semiconductor device according to claim 1, wherein
   the adhesion portion is one of a plurality of adhesion portions,
   the plurality of adhesion portions are spaced apart from each other in a direction along a perimeter of the opening peripheral portion defining the second opening, and
   in a region between adjacent adhesion portions, the second protection film is disposed on the end portion of the second metal layer through the end portion of the oxidation inhibition layer.

3. The semiconductor device according to claim 1, wherein
   the opening peripheral portion has a rectangular loop shape, and
   the adhesion portion is located at a position corresponding to at least one of four corners of the rectangular loop shape of the opening peripheral portion.

4. The semiconductor device according to claim 1, wherein
   the opening peripheral portion has a rectangular loop shape, and the adhesion portion is located at a position corresponding to at least one of sides connecting adjacent corners of the rectangular loop shape of the opening peripheral portion.

5. The semiconductor device according to claim 1, wherein
the overlap length is 0.65 millimeters or less.

6. The semiconductor device according to claim 1, wherein
the adhesion portion is provided as a portion of the first protection film and as a projection projecting from an opening edge of the first protection film defining the first opening.

7. The semiconductor device according to claim 1, wherein
the adhesion portion is located at a position apart from an opening edge of the first protection film defining the first opening, on the first metal layer, and
the adhesion portion is made of a material containing a same material as the first protection film.

8. A semiconductor device comprising:
a semiconductor substrate having an element;
a first metal layer disposed on a surface of the semiconductor substrate;
a first protection film defining a first opening above the first metal layer and covering an end portion of the first metal layer;
a second metal layer disposed on the first metal layer in the first opening;
an oxidation inhibition layer disposed on the second metal layer in the first opening;
a second protection film defining a second opening and covering an end portion of the oxidation inhibition layer and the first protection film, the second protection film having an opening peripheral portion on a periphery of the second opening, the end portion of the oxidation inhibition layer being covered with the opening peripheral portion; and
an adhesion portion adhering to a portion of a lower surface of the opening peripheral portion of the second protection film, the lower surface facing the end portion of the oxidation inhibition layer, an adhesive strength between the adhesion portion and the second protection film being higher than an adhesive strength between the oxidation inhibition layer and the second protection film, wherein
the adhesion portion is provided on the second metal layer, and
the adhesion portion is provided by a rough portion that contains an oxide of a same metal as a main component of the second metal layer.

9. A semiconductor device comprising:
a semiconductor substrate having an element;
a first metal layer disposed on a surface of the semiconductor substrate;
a first protection film defining a first opening above the first metal layer and covering an end portion of the first metal layer;
a second metal layer disposed on the first metal layer in the first opening;
a second protection film defining a second opening and covering an end portion of the second metal layer and the first protection film, the second protection film having an opening peripheral portion on a periphery of the second opening, the end portion of the second metal layer being covered with the opening peripheral portion;
an adhesion portion adhering to a portion of a lower surface of the opening peripheral portion of the second protection film, the lower surface facing the end portion of the oxidation inhibition layer;
a solder; and
a metal member connected to the second metal layer through the solder, wherein
the solder is spread to at least a portion above the second metal layer in a region directly under the opening peripheral portion and where the adhesion portion does not exist.

10. The semiconductor device according to claim 9, wherein
the metal member is larger than the second opening, and is disposed to enclose the second metal layer in a projection view projected in a thickness direction of the semiconductor substrate.

* * * * *